United States Patent
Nishimura et al.

(10) Patent No.: US 11,453,945 B2
(45) Date of Patent: Sep. 27, 2022

(54) GAS SUPPLY APPARATUS

(71) Applicant: Toshiba Mitsubishi-Electric Industrial Systems Corporation, Tokyo (JP)

(72) Inventors: Shinichi Nishimura, Tokyo (JP); Kensuke Watanabe, Tokyo (JP); Yoichiro Tabata, Tokyo (JP)

(73) Assignee: TOSHIBA MITSUBISHI-ELECTRIC INDUSTRIAL SYSTEMS CORPORATION, Tokyo (JP)

( * ) Notice: Subject to any disclaimer, the term of this patent is extended or adjusted under 35 U.S.C. 154(b) by 0 days.

(21) Appl. No.: 16/888,898

(22) Filed: Jun. 1, 2020

(65) Prior Publication Data

US 2020/0291515 A1 Sep. 17, 2020

Related U.S. Application Data

(62) Division of application No. 15/767,262, filed as application No. PCT/JP2016/050188 on Jan. 6, 2016, now abandoned.

(51) Int. Cl.
*H01J 37/32* (2006.01)
*C23C 16/455* (2006.01)
(Continued)

(52) U.S. Cl.
CPC ........ *C23C 16/4557* (2013.01); *C23C 16/452* (2013.01); *C23C 16/455* (2013.01);
(Continued)

(58) Field of Classification Search
CPC ... C23C 16/4557; C23C 16/455; C23C 16/50; C23C 16/4583; C23C 16/45553;
(Continued)

(56) References Cited

U.S. PATENT DOCUMENTS

| 9,869,022 B2 | 1/2018 | Sawada |
| 10,403,474 B2 | 9/2019 | Phillips et al. |

(Continued)

FOREIGN PATENT DOCUMENTS

| CN | 101688297 A | 3/2010 |
| JP | 5-283372 A | 10/1993 |

(Continued)

OTHER PUBLICATIONS

Korean Office Action dated Nov. 22, 2019, in Patent Application No. 10-2018-7015815, 12 pages (with English translation).
(Continued)

*Primary Examiner* — Rudy Zervigon
(74) *Attorney, Agent, or Firm* — Xsensus LLP

(57) ABSTRACT

A gas ejector of a gas supply apparatus includes a nozzle portion. The opening of a first-stage restricting cylinder constituting the nozzle portion has a circular cross-sectional shape with a diameter r1. A second-stage restricting cylinder is continuously formed with the first-stage restricting cylinder along a Z direction. The opening of the second-stage restricting cylinder has a circular cross-sectional shape with a diameter r2, and supplies a source gas supplied from the first-stage restricting cylinder to a low-vacuum processing chamber below. At this time, the diameter r2 is set to satisfy "r2>r1".

12 Claims, 11 Drawing Sheets

(51) Int. Cl.
  *H01L 21/31* (2006.01)
  *C23C 16/452* (2006.01)
  *C23C 16/458* (2006.01)
  *C23C 16/50* (2006.01)

(52) U.S. Cl.
  CPC .... *C23C 16/4583* (2013.01); *C23C 16/45536* (2013.01); *C23C 16/45544* (2013.01); *C23C 16/45553* (2013.01); *C23C 16/50* (2013.01); *H01J 37/3244* (2013.01); *H01J 37/32348* (2013.01); *H01J 37/32449* (2013.01); *H01L 21/31* (2013.01); *H01J 2237/3321* (2013.01); *H01J 2237/3323* (2013.01)

(58) Field of Classification Search
  CPC ........ C23C 16/45544; C23C 16/45536; C23C 16/452; H01J 37/32449; H01J 37/3244; H01J 37/32348; H01J 2237/3323; H01J 2237/3321; H01L 21/31; H01L 21/67098; H01L 21/67017
  USPC ............ 118/715, 723 E; 156/345.31, 345.32, 156/345.33, 345.34, 345.43, 345.44, 156/345.35
  See application file for complete search history.

(56) References Cited

U.S. PATENT DOCUMENTS

| | | | |
|---|---|---|---|
| 10,407,771 B2 | 9/2019 | Cui et al. | |
| 2003/0019580 A1 | 1/2003 | Strang | |
| 2003/0209323 A1* | 11/2003 | Yokogaki | C23C 16/45565 |
| | | | 156/345.33 |
| 2006/0137607 A1* | 6/2006 | Seo | C23C 16/45572 |
| | | | 257/E21.295 |
| 2008/0305246 A1* | 12/2008 | Choi | C23C 16/45565 |
| | | | 118/728 |
| 2012/0247673 A1* | 10/2012 | Hayashi | C23C 16/503 |
| | | | 156/345.33 |
| 2014/0097270 A1 | 4/2014 | Liang et al. | |
| 2015/0376784 A1* | 12/2015 | Wu | C23C 16/45508 |
| | | | 427/255.28 |

FOREIGN PATENT DOCUMENTS

| | | |
|---|---|---|
| JP | 11-293469 A | 10/1999 |
| JP | 2001-135628 A | 5/2001 |
| JP | 2003-529926 A | 10/2003 |
| JP | 2003-529926 A5 | 10/2003 |
| JP | 2004-111739 A | 4/2004 |
| JP | 2013-219380 A | 10/2013 |
| JP | 2014-86498 A | 5/2014 |
| KR | 10-2010-0034737 A | 4/2010 |
| KR | 10-2015-0056631 A | 5/2015 |
| WO | WO 01/75188 A2 | 10/2001 |
| WO | WO 2014/046896 A1 | 3/2014 |

OTHER PUBLICATIONS

Extended European Search Report dated Jul. 19, 2019 in Patent Application No. 16883579.1, 8 pages.

Japanese Office Action dated Sep. 4, 2018 in Japanese Patent Application No. 2017-559971 (with unedited computer generated English translation), 9 pages.

International Preliminary Report on Patentability and Written Opinion dated Jul. 19, 2018 in PCT/JP2016/050188 (with English translation), 13 pages.

International Search Report dated Apr. 5, 2016, in PCT/JP2016/050188 filed Jan. 16, 2016.

Office Action dated Sep. 28, 2021, in corresponding Chinese patent Application No. 201680068427.2, 22 pages.

* cited by examiner

GAS SUPPLY APPARATUS

CROSS-REFERENCE TO RELATED APPLICATIONS

The present application is a divisional of U.S. application Ser. No. 15/767,262, filed Apr. 10, 2018, which is based on PCT filing PCT/JP2016/050188, filed Jan. 6, 2016, the entire contents of each are incorporated herein by reference.

TECHNICAL FIELD

The present invention relates to a gas supply apparatus for a film formation process.

BACKGROUND ART

In the field of semiconductor manufacturing, processes such as a film formation process of forming an insulating film or the like on a substrate of an object to be processed such as a wafer, and etching, cleaning, and the like of a film surface formed by film formation are performed. These processes are required to be performed at high speed and with high-quality techniques. For example, together with various high-performance and excellent film formation processes including film formation of a highly insulating thin film, a semiconductor thin film, a high dielectric thin film, a light-emitting thin film, a highly magnetic thin film, a super-hard thin film, and the like, an etching process, peeling, and a cleaning process with high quality have been pursued. Realization of high-quality and uniform film formation on a surface of a wafer (surface of a substrate to be processed) having a large area and high processing speed are highly valued.

The various thin-film techniques, and etching, peeling and cleaning processes described above have been applied not only to semiconductor elements but also to various fields of application.

In particular, among them, in the thin-film formation technique, a basic technique of promoting nitriding, oxidation and hydrogen bonding by chemical reaction on a surface of a substance such as a metal or an insulator material is important in thin-film formation. Based on this basic technique, a thin film is subjected to various heat treatments and chemical-reaction processes, and thus high-quality thin-film formation is realized.

Specifically, in the manufacture of a semiconductor device, there are film formation methods of high-function films such as a low-impedance highly conductive film functioning as circuit wiring in a semiconductor chip, a highly magnetic film having a wiring coil function or a magnet function of a circuit, a high dielectric film having a capacitor function of a circuit, and a highly insulating film having a high insulating function with a little electrical leakage current, the highly insulating film formed by oxidation or nitriding. In order to realize these film formation methods for high-function films, a thermal CVD (Chemical Vapor Deposition) apparatus, a photo-CVD apparatus, a plasma CVD apparatus, a thermal ALD (Atomic Layer Deposition) apparatus, or a plasma ALD apparatus is used. In particular, plasma CVD/ALD apparatuses are often used. For example, the plasma CVD/ALD apparatus is advantageous in that the plasma CVD/ALD apparatus has lower film-formation temperature and can perform a film formation process faster in a shorter time than a thermal/photo CVD/ALD apparatus.

For example, in a case where a gate insulating film such as a nitride film (SiON, HfSiON or the like) or an oxide film ($SiO_2$, $HfO_2$) is formed on a wafer which is a substrate to be processed, the following technique using a plasma CVD/ALD apparatus is generally adopted.

The thermal CVD/ALD apparatus heats the wafer and the inside of a container to increase reactivity of a supply gas to form a film on the wafer; however, if the wafer is exposed to a high temperature, thermal damage or the like leads to a decrease in yield.

Therefore, nowadays, film formation with plasma CVD/ALD using plasma is often used in lieu of thermal CVD/ALD. (Plasma) CVD/ALD techniques are disclosed in, for example, Patent Documents 1 to 3.

In a conventional film formation processing apparatus using plasma CVD/ALD, thermal CVD/ALD or the like as disclosed in Patent Document 1, a method is adopted in which the film formation apparatus is filled with gas and the filled gas is activated by plasma energy or thermal energy, and a thin film is deposited by a chemical reaction process with the gas supplied to a surface of a wafer. The activated gas filled in the film formation processing apparatus only has a random gas flow velocity due to Brownian motion, and a gas particle itself does not have high speed. Therefore, the method is effective for a deposition film formation reaction on a surface of a substrate, but is not suitable for uniformly forming a film on an extremely uneven surface of a substrate and for uniformly forming a three-dimensional film surface. In addition, in the case of a highly reactive gas, since chemical reaction time is short, the lifetime is very short. Therefore, there is a disadvantage that reaction is promoted only on a surface of a substrate, a supply gas does not reach an extremely uneven surface with high aspect ratio, and uniform film formation cannot be performed. In this case, it is necessary to lead a reactant gas to the inside of a wafer in a short time so that film formation is performed by uniformly carrying out reaction even inside the wafer, or to give energy to gas filled inside the wafer to convert the gas into an activated gas.

In a CVD/ALD film formation processing apparatus disclosed in Patent Document 2, gas is uniformly supplied into a container and deposited on entirety of a wafer. However, there is a problem that in a case where reactivity of the gas is high, the gas loses the reactivity before reaching the wafer. Therefore, there are known a method of generating plasma in a container to generate a highly reactive gas and supplying the gas to a substrate, and a method of increasing the temperature inside a container or a wafer to increase reactivity.

In a plasma CVD/ALD apparatus using plasma disclosed in Patent Document 3, energy of plasma is given to gas being supplied, and the gas is converted into a highly reactive gas and supplied. In that case, there is an advantage that the temperature inside a wafer or a container can be set lower than the temperature in the case of thermal film formation; however, since a plasma generation source and a surface to be processed are required to be located close to each other, there is a disadvantage that the substrate itself, which is located close to the plasma generation source, is damaged due to an influence of plasma. In addition, when the conventional CVD/ALD film formation processing apparatus and the currently operating plasma CVD/ALD apparatus are compared with each other, the currently operating plasma CVD/ALD apparatus is suitable for a three-dimensional film formation process on a relatively less uneven surface of a wafer. However, it is substantially impossible to realize a three-dimensional film formation process on a more uneven surface of a wafer having higher aspect ratio and to obtain a high-quality three-dimensional film formation structure.

In a manufacturing method for manufacturing a three-dimensional-structure semiconductor disclosed in Patent Document 4, it is necessary to form a uniform barrier film located around a TSV (through-silicon via) structure. In this case, there is limitation in uniform film formation in the depth direction. Therefore, the barrier film to be formed is divided into a plurality of layers in the depth direction, and several layers are formed each time.

PRIOR ART DOCUMENTS

Patent Documents

Patent Document 1: Japanese Patent Application Laid-Open No. 2004-111739
Patent Document 2: Japanese Patent Application Laid-Open No. 2013-219380
Patent Document 3: Japanese Patent Application Laid-Open No. 2001-135628
Patent Document 4: Japanese Patent Application Laid-Open No. 2014-86498

SUMMARY

Problem to be Solved by the Invention

As described above, in the conventional thin-film formation techniques, since the film formation process is performed by supplying a supply gas and setting the inside of the film formation processing apparatus at a predetermined pressure, it is not necessary to supply gas having directivity at high speed. Therefore, the conventional thin-film formation techniques are not suitable for a film formation process for an uneven surface, which has been recently demanded. The techniques are particularly not suitable for a film formation process for a wafer having high aspect ratio, a representative example of which is a wafer having a deep hole.

In addition, a method is suitable for supplying a highly reactive gas to a surface of a wafer in a short time. In the method, a single restricting cylinder (orifice) is provided as means for quickly supplying gas to a low-vacuum processing chamber to increase gas supply speed, the gas is ejected in a low-vacuum environment in the low-vacuum processing chamber, and thus, the gas is ejected at an ultra-high speed exceeding Mach. In that case, it is necessary to set the pressure difference between the pressure in a gas supply apparatus and the pressure in the low-vacuum processing chamber in a low-vacuum state to be greater than or equal to a predetermined pressure ratio. As the pressure difference is greater or the pressure inside the low-vacuum processing chamber is lower, the gas is supplied at higher speed and the gas can be supplied on the surface of the wafer in a shorter time. If the diameter of the opening of a flow path in the restricting cylinder is reduced and the pressure difference is increased, flow velocity becomes faster and thus gas supply time becomes shorter.

However, in a case of ejecting gas at an ultra-high speed exceeding Mach, the gas speed affects a gas flow velocity frame (gas jet speed) at the gas impact pressure and the temperature condition of Mach speed, and brings about an effect of extremely lowering the gas flow velocity at a certain ejection position. As a result, a phenomenon called a Mach disk condition (condition where the gas flow velocity is extremely lowered at a certain ejection position) occurs.

It is preferable to minimize the phenomenon of this Mach disk condition; however, no specific solution has been found.

The present invention solves the above-described problems. An object of the present invention is to provide a gas supply apparatus capable of effectively suppressing a phenomenon in which extreme deceleration of gas occurs in association with an impact pressure and a temperature condition generated by a gas supplied to a substrate at an ultra-high speed exceeding Mach when the gas is supplied to the substrate at the ultra-high speed.

Means to Solve the Problem

A gas supply apparatus according to the present invention includes: a mounting portion for mounting a substrate to be processed; and a gas ejector which is provided above the mounting portion and supplies gas from a processing chamber having an opening on a bottom surface to the substrate to be processed. The gas ejector includes: a primary accommodating chamber which temporarily accommodates gas supplied from a gas supply port; the processing chamber; and a nozzle portion which is provided between the primary accommodating chamber and the processing chamber. The nozzle portion has: a first restricting cylinder whose opening has a circular cross-sectional shape with a first diameter in plan view, and which supplies the gas in the primary accommodating chamber downward; and a second restricting cylinder whose opening has a circular cross-sectional shape with a second diameter in plan view, and which supplies the gas supplied from the first restricting cylinder to the processing chamber. The first diameter is set such that pressure difference between the primary accommodating chamber and the processing chamber is greater than or equal to a predetermined pressure ratio. The second diameter is set to be longer than the first diameter.

Effects of the Invention

In the gas ejector of the gas supply apparatus of the present invention according to claim 1, the first restricting cylinder having the first diameter in the nozzle portion can give directivity to gas to be ejected to the processing chamber. Thus, gas can be supplied to the substrate to be processed at an ultra-high speed exceeding Mach. In this case, due to existence of the second restricting cylinder provided between the first restricting cylinder and the processing chamber, it is possible to suppress a Mach disk phenomenon in which ejected gas is extremely decelerated by the impact pressure and the temperature condition generated by the gas ejecting at an ultra-high speed.

As a result, the gas supply apparatus of the present invention according to claim 1 has the effect of being able to supply gas suitable for film formation on a surface of a wafer with high aspect ratio to a substrate to be processed.

The objects, features, aspects, and advantages of the present invention will become more apparent from the following detailed description and the accompanying drawings.

DESCRIPTION OF EMBODIMENTS

Embodiment 1

Figure 1:
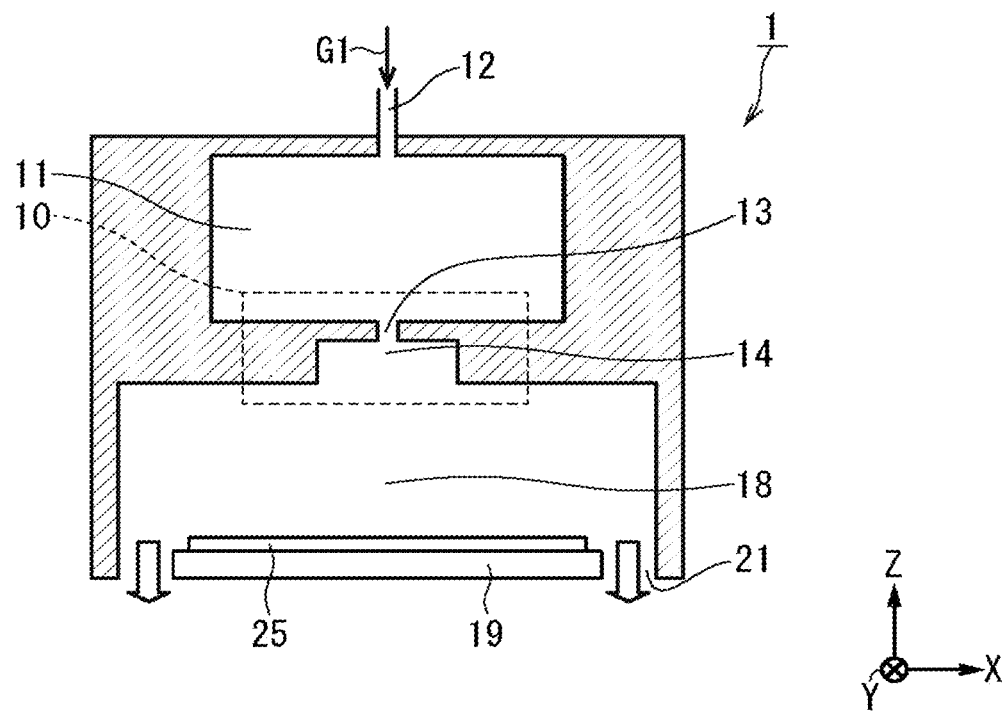
FIG. 1 is an explanatory view illustrating a configuration of a gas supply apparatus according to Embodiment 1 of the present invention.

FIG. 1 is an explanatory view illustrating a configuration of a gas supply apparatus according to Embodiment 1 of the present invention. In FIG. 1, an XYZ orthogonal coordinate system is illustrated.

As illustrated in FIG. 1, the gas supply apparatus according to Embodiment 1 includes: a mounting table 19 (mounting portion) for mounting a wafer 25 which is a substrate to be processed; and a gas ejector 1 which is provided above the mounting table 19 and supplies gas from a low-vacuum processing chamber 18 (processing chamber) having an opening on a bottom surface to the wafer 25 below.

The gas ejector 1 has, as main components, a primary accommodating chamber 11, a gas supply port 12, a first-stage restricting cylinder 13 (first restricting cylinder), a second-stage restricting cylinder 14 (second restricting cylinder), and the low-vacuum processing chamber 18 (processing chamber).

A nozzle portion 10 is formed of a configuration including a group of the restricting cylinders 13 and 14. That is, the nozzle portion 10 is provided between the primary accommodating chamber 11 and the low-vacuum processing chamber 18.

The opening of the first-stage restricting cylinder 13 constituting the nozzle portion 10 has a circular cross-sectional shape with a diameter r1 (first diameter) on XY plane (in plan view). The first-stage restricting cylinder 13 supplies a source gas G1 in the primary accommodating chamber 11 downward (in a −Z direction). The diameter r1 is set such that pressure difference between the primary accommodating chamber 11 and the low-vacuum processing chamber 18 is greater than or equal to a predetermined pressure ratio.

The second-stage restricting cylinder 14 is continuously formed with the first-stage restricting cylinder 13 along a Z direction. The opening of the bottom surface of the second-stage restricting cylinder 14 has a circular cross-sectional shape with a diameter r2 (second diameter) on XY plane (in plan view). The second-stage restricting cylinder 14 supplies the source gas G1 supplied from the first-stage restricting cylinder 13 to the low-vacuum processing chamber 18 below. The diameter r2 is set so as to satisfy "r2>r1".

For example, the diameter r1 of the first-stage restricting cylinder 13 is 1.35 mm in diameter, the depth (formation length extending in the Z direction) of the first-stage restricting cylinder 13 is 1 mm, the diameter r2 of the second-stage restricting cylinder 14 is 8 mm in diameter, and the depth (formation length extending in the Z direction) of the second-stage restricting cylinder 14 is 4 mm. For example, nitrogen gas is supplied as the source gas G1 at a flow rate of 4 slm (standard liter per minute). Therefore, the source gas G1 that has passed through the first-stage restricting cylinder 13 becomes an ultra-high-speed gas and is supplied into the low-vacuum processing chamber 18 via the second-stage restricting cylinder 14.

The primary accommodating chamber 11 temporarily accommodates the source gas G1 supplied from the gas supply port 12. The pressure in the primary accommodating chamber 11 is a primary pressure.

After the source gas G1 supplied from the gas supply port 12 passes through the primary accommodating chamber 11, a secondary pressure is determined by the first-stage restricting cylinder 13. The source gas G1 is supplied into the low-vacuum processing chamber 18 via the second-stage restricting cylinder 14.

At that time, a pressure ratio PC between the primary pressure in the primary accommodating chamber 11 and the secondary pressure in the low-vacuum processing chamber 18 is set to greater than or equal to 30 times. Then, the flow velocity of the source gas G1 that has passed through the first-stage restricting cylinder 13 becomes a flow velocity greater than or equal to Mach due to the pressure ratio PC. Due to the existence of the second-stage restricting cylinder 14, a phenomenon in which a Mach disk condition generated by a high-speed jet of the source gas G1 occurs is suppressed. Then, the source gas G1 is supplied into the low-vacuum processing chamber 18.

For example, if the primary pressure in the primary accommodating chamber 11 is 30 kPa and the pressure in the low-vacuum processing chamber 18 is 266 Pa, the maximum Mach number of the source gas G1 as the ultra-high-speed gas exceeds "5" and is supplied to the wafer 25 on the mounting table 19.

At this time, since the Mach disk condition which is likely to occur is effectively suppressed by the existence of the second-stage restricting cylinder 14, the gas supply apparatus can supply the gas to the wafer at a higher speed than a conventional gas supply apparatus.

That is, due to provision of the second-stage restricting cylinder 14, pressure distribution and flow-velocity distribution in the low-vacuum processing chamber 18 can be relaxed to avoid an occurrence of a Mach disk MD condition, and the source gas G1 is supplied into the low-vacuum processing chamber 18 and is supplied to the wafer 25 placed on the mounting table 19 (wafer table). After the gas has been reacted, the gas is exhausted from an exhaust port 21 provided between the gas ejector 1 and the mounting table 19.

(Comparison with Conventional Configuration and the Like)

Figure 7:
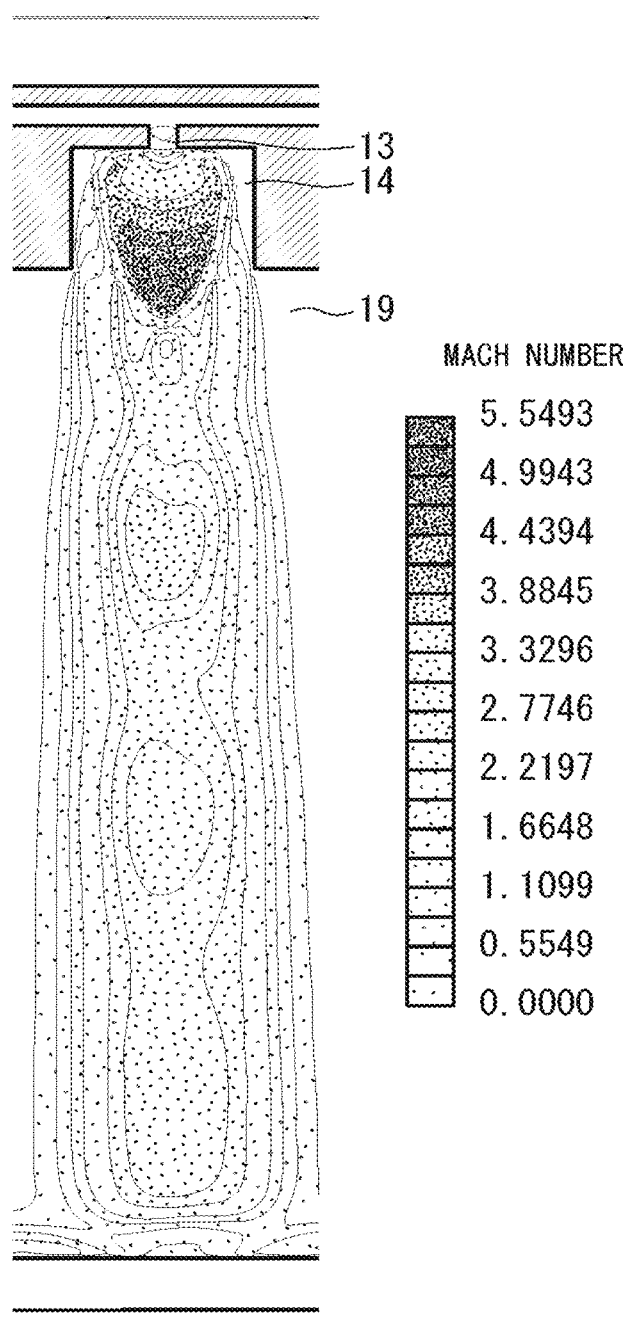
FIG. 7 is an explanatory view schematically illustrating a speed condition of a gas jet using the gas supply apparatus according to Embodiment 1.

FIG. 7 is an explanatory view schematically illustrating a speed condition of a gas jet using the gas supply apparatus according to Embodiment 1 having the nozzle portion 10.

Figure 8:
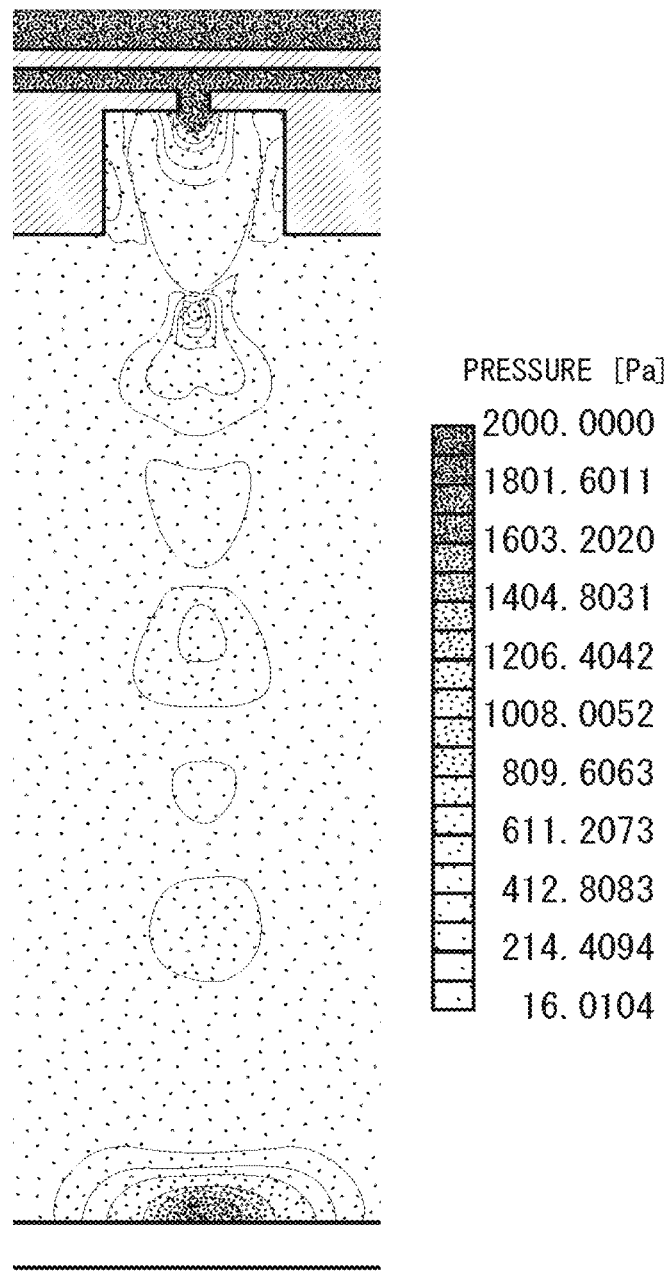
FIG. 8 is an explanatory view schematically illustrating a pressure condition of a gas jet using the gas supply apparatus according to Embodiment 1.

FIG. 8 is an explanatory view schematically illustrating a pressure condition of the gas jet using the gas supply apparatus according to Embodiment 1 having the nozzle portion 10.

Figure 9:
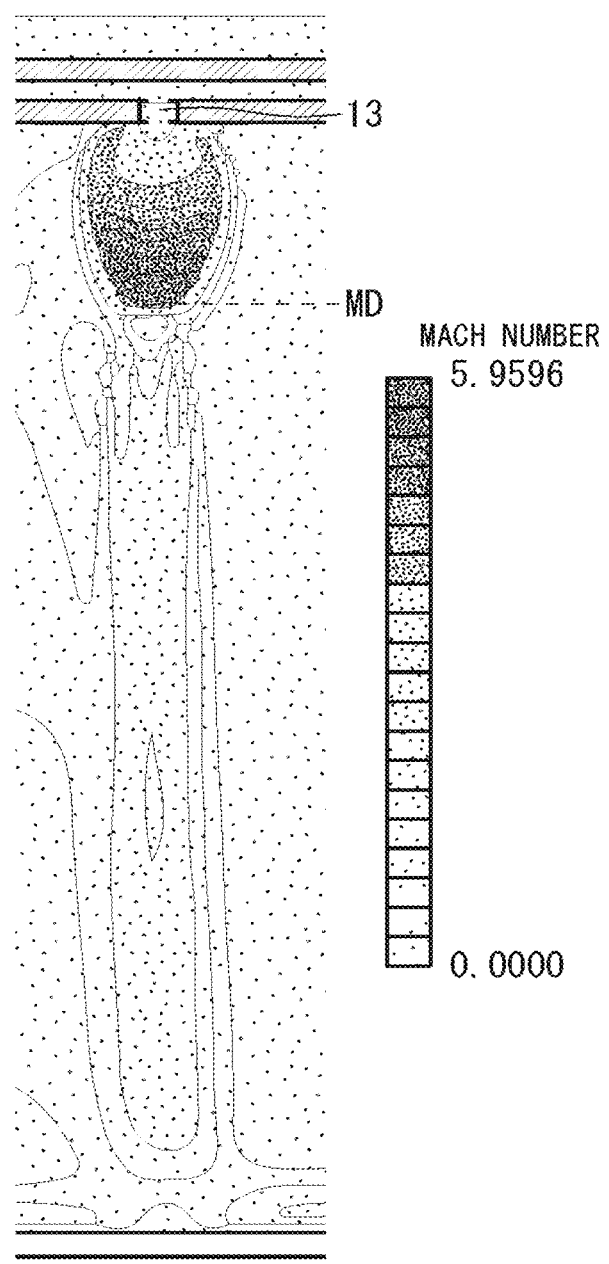
FIG. 9 is an explanatory view schematically illustrating a speed condition of a gas jet using a conventional gas supply apparatus.

FIG. 9 is an explanatory view schematically illustrating a speed condition of a gas jet using a conventional gas supply apparatus having a nozzle portion configured only of a first-stage restricting cylinder 13.

Figure 10:
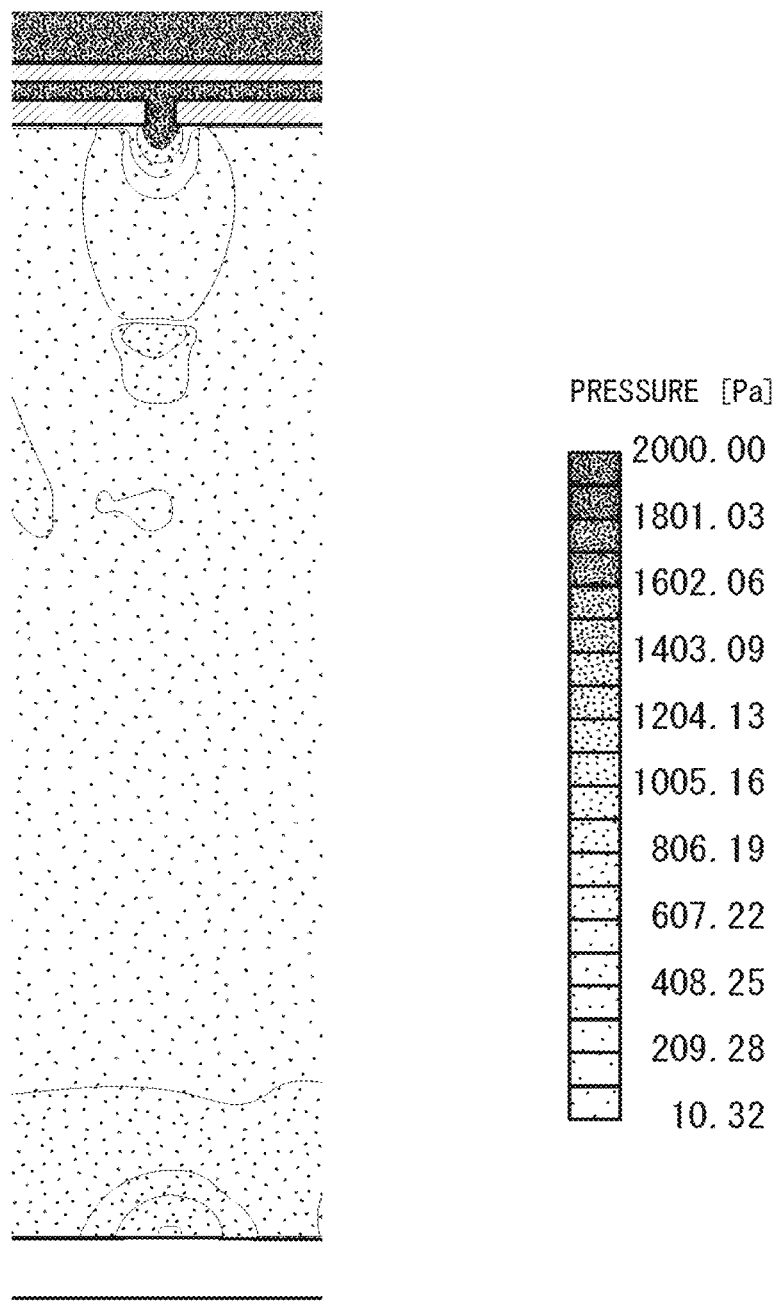
FIG. 10 is an explanatory view schematically illustrating a pressure condition of the gas jet using the conventional gas supply apparatus.
Figure 11:
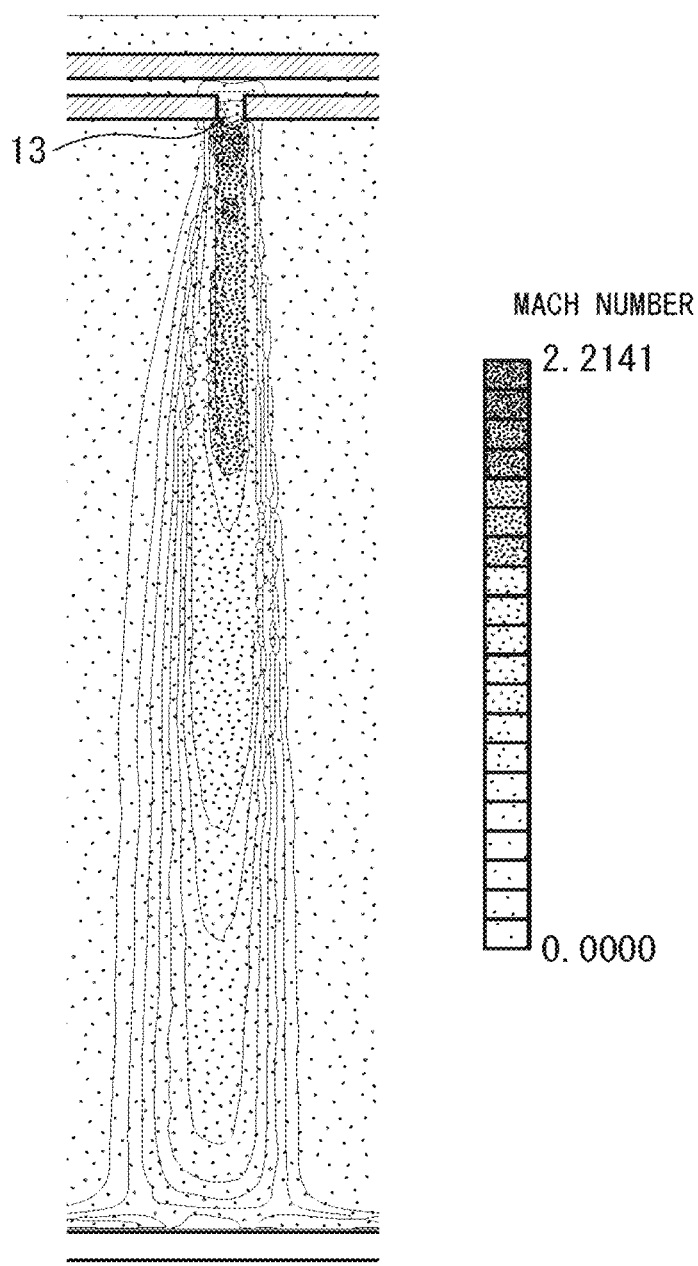
FIG. 11 is an explanatory view schematically illustrating a speed condition of a gas jet in a case where the pressure ratio of a primary accommodating chamber to a low-vacuum processing chamber is less than 30 times.
Figure 12:
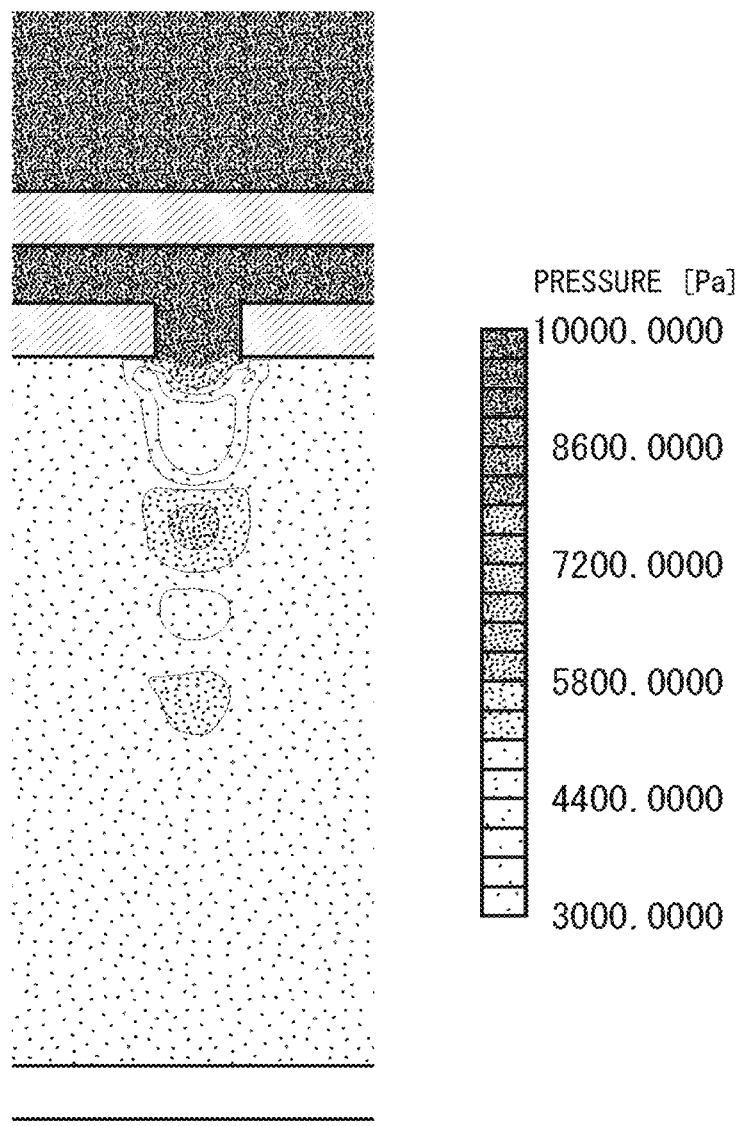
FIG. 12 is an explanatory view schematically illustrating a pressure condition of the gas jet in a case where the pressure ratio of the primary accommodating chamber to the low-vacuum processing chamber is less than 30 times.

FIG. 10 is an explanatory view schematically illustrating a pressure condition of the gas jet using the conventional gas supply apparatus having the nozzle portion configured only of the first-stage restricting cylinder 13. In FIGS. 7 to 10, the uppermost hatched portion corresponds to, for example, a formation region of an upper electrode 22 in Embodiment 4 to be described later. In FIGS. 11 and 12, the uppermost hatched portion corresponds to the formation region of the upper electrode 22 in Embodiment 4 to be described later.

As illustrated in FIGS. 8 and 10, the above-described pressure ratio PC of the primary pressure to the secondary pressure is set to greater than or equal to 30 times.

As is apparent from the comparison between FIG. 7 and FIG. 9, by avoiding the phenomenon in which a Mach disk MD occurs, the gas supply apparatus according to Embodiment 1 can supply the source gas G1 to the wafer 25 without extremely lowering the speed of the source gas G1. In contrast, as illustrated in FIG. 9, a Mach disk MD is generated in the conventional gas supply apparatus.

FIG. 11 is an explanatory view schematically illustrating a speed condition of a gas jet in a case where the pressure ratio PC of the primary accommodating chamber 11 to the low-vacuum processing chamber 18 is less than 30 times in the configuration according to Embodiment 1.

FIG. 12 is an explanatory view schematically illustrating a pressure condition of the gas jet in the case where the pressure ratio PC of the primary accommodating chamber 11 to the low-vacuum processing chamber 18 is less than 30 times in the configuration in Embodiment 1. In FIGS. 11 and 12, the uppermost hatched portion corresponds to the formation region of the upper electrode 22 in Embodiment 4 to be described later.

As illustrated in FIG. 12, the above-described pressure ratio PC of the primary pressure to the secondary pressure is set to less than 30 times.

As is apparent from the comparison between FIG. 7 and FIG. 11, in a case where the pressure ratio PC is greater than or equal to 30 times, speed distribution with a higher jet velocity than that in a case where the pressure ratio PC is less than 30 times is obtained, and gas having directivity can be reliably supplied to the surface of the wafer 25.

(Effects Provided by Second-Stage Restricting Cylinder 14)

Figure 13:
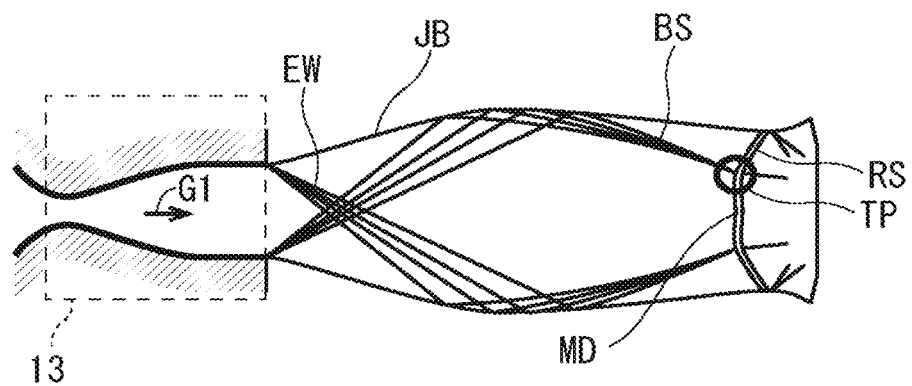
FIG. 13 is an explanatory view schematically illustrating a Mach disk generation structure in the case of using the conventional gas supply apparatus.

FIG. 13 is an explanatory view schematically illustrating a Mach disk generation structure in a case of using the conventional gas supply apparatus having the nozzle portion configured only of the first-stage restricting cylinder 13.

In a case where when the source gas G1 which is the supply gas passes through the first-stage restricting cylinder 13 (orifice), the primary pressure of the primary accommodating chamber 11 is higher than the secondary pressure of the low-vacuum processing chamber 18, that is, ejection pressure of the source gas G1 from the first-stage restricting cylinder 13 is higher than the pressure in the low-vacuum processing chamber 18, a flow having passed through an outlet (orifice outlet) of the first-stage restricting cylinder 13 causes a phenomenon called a shock cell structure (shock cell), and the above shock cell structures are periodically observed in a downstream direction. The shock cell structure means a structure of a shock wave in which reflected shock waves RS to be described later are repeatedly obtained at boundary regions JB (Jet Boundary) to be described below.

Such a case where the pressure at the orifice outlet is greater than the pressure inside the low-vacuum processing chamber 18 is called under expansion and the flow expands after passing through the orifice outlet.

In a case where the pressure at the orifice outlet is further greater than the pressure in the low-vacuum processing chamber 18, the gas has not yet fully expanded. Therefore, expansion waves EW are generated at an edge of the orifice outlet, and the gas greatly expands to the outside. In a case where the Mach number of the gas is great, the expansion waves EW are reflected by the boundary region JB (Jet Boundary), become compression waves and return to a jet center axis side. Note that the compression wave is a wave whose pressure is higher than a reference value. When the compression wave passes through, the pressure at the point where the compression wave passes rises. The expansion wave means a wave whose pressure is lower than a reference value. When the expansion wave passes through, the pressure at the point where the expansion wave passes lowers.

As described, in a case where the pressure difference before and after the gas passes through the nozzle portion is great, the formed compression waves catch up with preceding compression waves to form barrel-shaped barrel shock waves BS (barrel shock). When the pressure difference becomes further greater, the barrel shock waves BS cannot normally intersect on the center axis of the jet, and in the axisymmetric jet, a disk-shaped normal shock wave called a Mach disk MD (Mach shock wave) is formed. The flow behind the Mach disk MD is a subsonic flow. A reflected shock wave RS (Reflection Shock) is generated from an end of the barrel shock wave BS. Note that a triple point TP is a point at which the barrel shock wave BS which is a compression wave, the Mach disk MD, and the reflected shock wave RS intersect.

Figure 14:
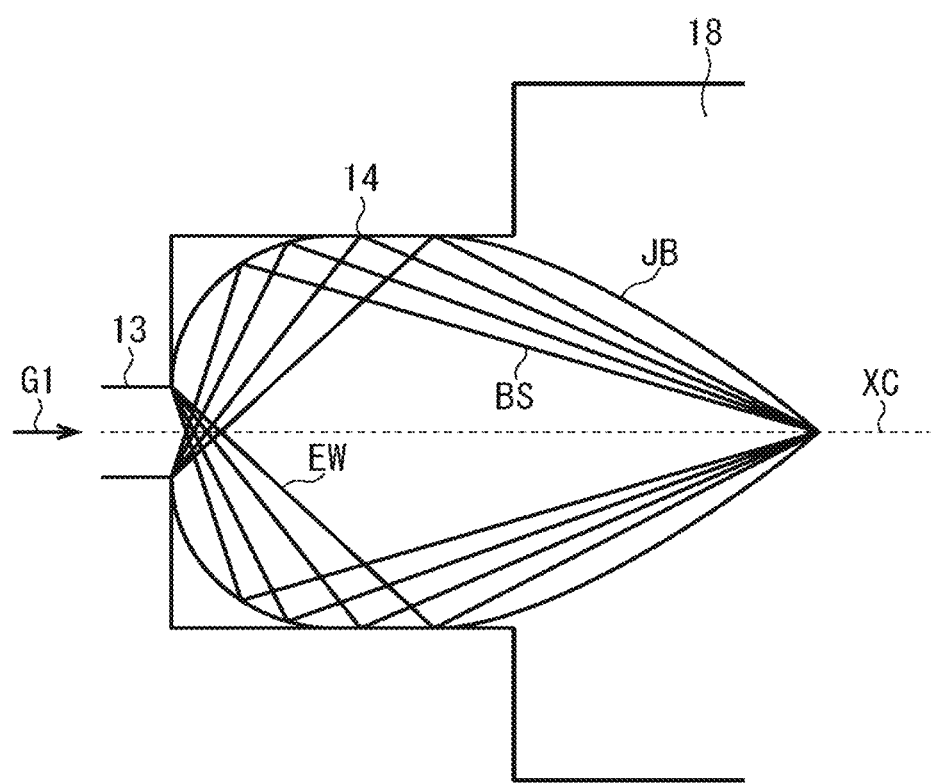
FIG. 14 is an explanatory view schematically illustrating effects in the case of using the gas supply apparatus according to the present embodiment.

In contrast, as illustrated in FIG. 14, in the gas ejector 1 according to Embodiment 1, since the second-stage restricting cylinder 14 continuously formed with the first-stage restricting cylinder 13 is provided, expansion waves EW are reflected by a side surface of the second-stage restricting cylinder 14, and therefore barrel shock waves BS can normally intersect on a center axis XC of the jet. Therefore, occurrence of a Mach disk MD can be avoided.

(Effects of the Invention and the Like)

In the gas ejector 1 of the gas supply apparatus according to Embodiment 1, the first-stage restricting cylinder 13 provided in the nozzle portion 10 and having the opening with the diameter r1 can give directivity to the source gas G1 to be ejected to the low-vacuum processing chamber 18. Thus, the gas can be supplied to the wafer 25 which is the substrate to be processed at an ultra-high speed exceeding Mach. In this case, due to existence of the second-stage restricting cylinder 14 provided between the first-stage restricting cylinder 13 and the low-vacuum processing chamber 18, it is possible to effectively suppress an occurrence of a Mach disk MD in which the ejected source gas G1 is extremely decelerated due to impact pressure and temperature caused by the source gas G1 ejecting at an ultra-high speed.

As a result, the gas supply apparatus according to Embodiment 1 has effects of being able to supply the source gas G1 suitable for formation of a film having a three-dimensional structure obtained by forming a film on a surface of the wafer 25 with high aspect ratio. For example, a reactive gas is supplied as the source gas G1 to the wafer 25.

Furthermore, the gas supply apparatus according to Embodiment 1 can supply the source gas G1 in a high-speed state to the wafer 25 which is a substrate to be processed, by setting the pressure ratio PC of the primary pressure in the primary accommodating chamber 11 to the secondary pressure in the low-vacuum processing chamber 18 to greater than or equal to 30 times.

In addition, the gas supply apparatus according to Embodiment 1 can more effectively suppress a Mach disk MD, by setting the diameter r2 of the second-stage restricting cylinder 14 to be within 30 mm in diameter.

In addition, it is preferable to adopt a first aspect where in the gas supply port 12, the primary accommodating chamber 11, the first-stage restricting cylinder 13, and the second-stage restricting cylinder 14 constituting the gas ejector 1, a gas contact region, which is a region to be brought into contact with the source gas G1, is formed to include quartz or an alumina material as a constituent material.

A reactive gas is generally used as the source gas G1. Therefore, in the gas ejector 1 according to Embodiment 1 adopting the first aspect, at least the above gas contact region is formed of quartz or an alumina material. Since a quartz material surface and an alumina surface are chemically stable to the above-described reactive gas, it is possible to supply the reactive gas into the low-vacuum processing chamber 18 in a state where there is little chemical reaction between the reactive gas and the gas contact region in contact with the reactive gas.

Furthermore, it is possible to reduce generation of corrosive substances as by-products accompanying chemical reaction with the reactive gas in the gas ejector 1. As a result, it is possible to supply, as the source gas G1, a clean reactive gas into the low-vacuum processing chamber 18, the reactive gas to be supplied containing no contaminants. Therefore, there is an effect of improving film-formation quality of the film formed on the wafer 25.

Furthermore, it is preferable to adopt a second aspect where the gas ejector 1 is heated to 100° C. or higher when the source gas G1 is supplied to the wafer 25, and the heated source gas G1 is supplied to the wafer 25. Note that a configuration such as providing a heating processing mechanism such as a hot plate or the like near the gas ejector 1 is considered in order to perform heating processing.

In the gas supply apparatus adopting the second aspect, the reactive gas used as the source gas G1 is subjected to heating processing and receives thermal energy. Therefore, the gas supply apparatus adopting the second aspect can supply a more highly reactive gas to the low-vacuum processing chamber 18, has an effect of forming a film on the wafer 25 at a higher speed, and has an effect of being able to perform a high-speed film formation process.

In addition, it is preferable to adopt a third aspect where the source gas G1 supplied from the gas supply port 12 is a gas containing at least nitrogen, oxygen, fluorine, and hydrogen.

In the gas supply apparatus adopting the third aspect, the source gas G1 supplied from the gas supply port 12 is a gas containing at least nitrogen, oxygen, fluorine, and hydrogen gas. Therefore, the gas supply apparatus adopting the third aspect can be used not only for formation of an insulating film such as a nitride film or an oxide film, but also for resist peeling and surface treatment of the wafer 25 with high aspect ratio using an activated gas of a fluorinated gas serving as an etching gas or a cleaning gas. Furthermore, by applying an ultra-high-speed gas such as a hydrogen radical gas to the surface of the wafer 25, the source gas G1 usable for applications other than insulating film formation, an etching process, and a cleaning function can also be supplied. Therefore, the gas supply apparatus can be used for various film formation processes.

In lieu of the third aspect, a fourth aspect where the source gas G1 supplied from the gas supply port 12 is a precursor gas may be adopted.

By using the precursor gas as the source gas G1 supplied from the gas supply port 12, the source gas G1 can be used as a reactive gas for surface treatment of the wafer 25 with high aspect ratio. In addition, the precursor gas to be a material of a deposited metal in film formation, the precursor gas necessary for film formation on the surface of the wafer 25, can be also supplied to the surface of the wafer 25 to perform film formation.

It is preferable to adopt as a fifth aspect a configuration in which a flow rate control unit that controls the gas flow rate of the source gas G1 supplied from the gas supply port 12 is provided such that the pressure is set to a pressure lower than or equal to the atmospheric pressure (1013.25 hPa) in the primary accommodating chamber 11 and higher than or equal to 10 kPa. Note that for example, a configuration in which a gas flow rate control device (mass flow controller; MFC) is provided in a supply path between a supply unit of the source gas G1 and the gas supply port 12 of the source gas G1, and the gas flow rate control device is controlled is considered as the flow rate control unit.

The gas supply apparatus adopting the fifth aspect can improve stability of the flow velocity of the ultra-high-speed gas in the source gas G1 ejected from the nozzle portion 10 of the gas ejector 1 into the low-vacuum processing chamber 18, and can exhibit the effect of improving film forming quality, such as uniformization of the thickness or the like of the film formed on the surface of the wafer 25.

Embodiment 2

Figure 2:
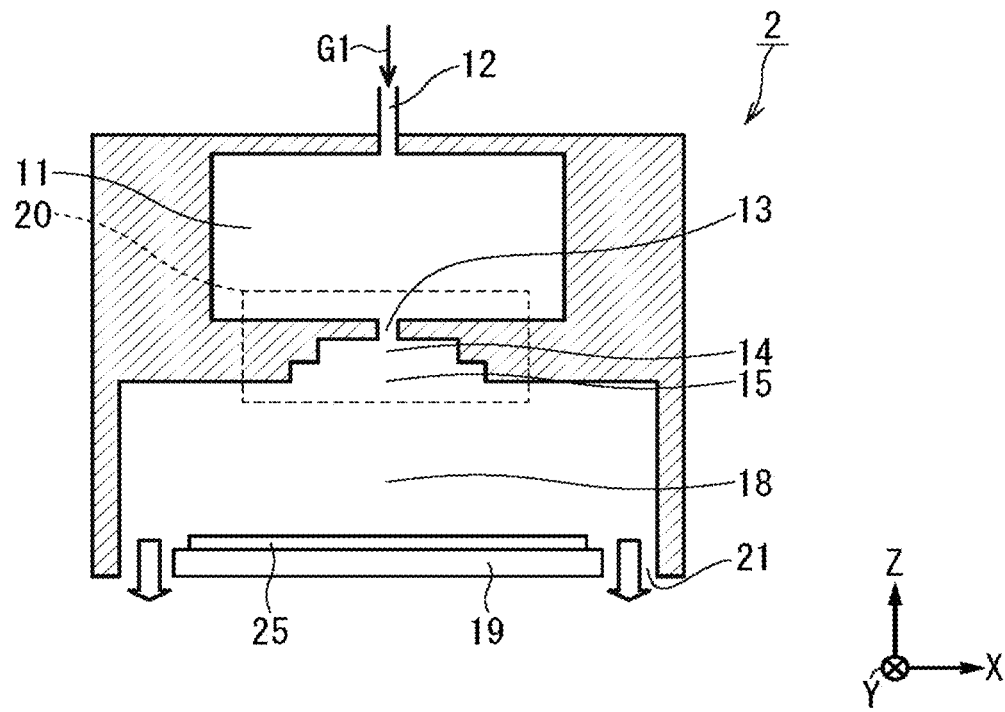
FIG. 2 is an explanatory view illustrating a configuration of a gas supply apparatus according to Embodiment 2 of the present invention.

FIG. 2 is an explanatory view illustrating a configuration of a gas supply apparatus according to Embodiment 2 of the present invention. In FIG. 2, an XYZ orthogonal coordinate system is illustrated.

As illustrated in FIG. 2, the gas supply apparatus according to Embodiment 2 includes: a mounting table 19 (mounting portion) for mounting a wafer 25 which is a substrate to be processed; and a gas ejector 2 which is provided above the mounting table 19 and supplies gas from a low-vacuum processing chamber 18 having an opening to the wafer 25.

The gas ejector 2 includes a primary accommodating chamber 11, a gas supply port 12, a first-stage restricting cylinder 13 (first restricting cylinder), a second-stage restricting cylinder 14 (second restricting cylinder), a third-stage restricting cylinder 15 (third restricting cylinder), and the low-vacuum processing chamber 18 as main components.

A nozzle portion 20 is formed of a configuration including a group of the restricting cylinders 13 to 15. That is, the nozzle portion 20 is provided between the primary accommodating chamber 11 and the low-vacuum processing chamber 18.

Similarly to Embodiment 1, the opening of the first-stage restricting cylinder 13 constituting the nozzle portion 20 has a circular cross-sectional shape with a diameter r1 in plan view, and supplies a source gas G1 in the primary accommodating chamber 11 downward.

The second-stage restricting cylinder 14 is continuously formed with the first-stage restricting cylinder 13 along a Z direction. Similarly to Embodiment 1, the opening of the bottom surface of the second-stage restricting cylinder 14 has a circular cross-sectional shape with a diameter r2 in plan view, and supplies the source gas G1 supplied from the first-stage restricting cylinder 13 downward.

The third-stage restricting cylinder 15 is continuously formed with the second-stage restricting cylinder 14 along the Z direction. The opening of the bottom surface of the third-stage restricting cylinder 15 has a circular cross-sectional shape with a diameter r3 (third diameter) on XY plane (in plan view). The third-stage restricting cylinder 15 supplies the source gas G1 supplied from the second-stage restricting cylinder 14 to the low-vacuum processing chamber 18 below. The diameter r3 is set so as to satisfy "r3>r2".

For example, in a case where the diameter r1 of the first-stage restricting cylinder 13 is 1.35 mm in diameter, the depth of the first-stage restricting cylinder 13 is 1 mm, the diameter r2 of the second-stage restricting cylinder 14 is 8 mm and the depth of the second-stage restricting cylinder 14 is 4 mm, the diameter r3 of the third-stage restricting cylinder 15 is set to 20 mm in diameter, the depth (formation length extending in the Z direction) of the third-stage restricting cylinder 15 is set to 46 mm, and a nitrogen gas, for example, is supplied at a flow rate of 4 slm. Then, the source gas G1 passed through the first-stage restricting cylinder 13 becomes an ultra-high-speed gas and is supplied into the low-vacuum processing chamber 18 via the second-stage restricting cylinder 14 and the third-stage restricting cylinder 15.

Note that since the other configurations of the gas ejector 2 are identical to those of the gas ejector 1 according to Embodiment 1, identical reference signs are appropriately given, and the description thereof will be omitted.

In the gas ejector 2 of the gas supply apparatus according to Embodiment 2, the nozzle portion 20 is configured of the first-stage restricting cylinder 13, the second-stage restricting cylinder 14, and the third-stage restricting cylinder 15 having the openings with the diameter r1, the diameter r2, and the diameter r3, respectively. Therefore, it is possible to give directivity to the source gas G1 ejected into the low-vacuum processing chamber 18. In this case, similarly to Embodiment 1, existence of the second-stage restricting cylinder 14 can effectively suppress a Mach disk MD phenomenon.

In addition, the gas supply apparatus according to the Embodiment 2 has effects similar to those of the gas supply apparatus according to Embodiment 1, and also has the effects in the case of adopting the first to fifth aspects.

Furthermore, the gas ejector 2 according to Embodiment 2 further includes the third-stage restricting cylinder 15 as the nozzle portion 20, and the diameter r3 of the third-stage restricting cylinder 15 is set to be longer than the diameter r2 of the second-stage restricting cylinder 14. Therefore, it is possible to supply the source gas G1 to the wafer 25 in a state where the occurrence of Mach disk MD caused by the high-speed jet generated at the pressure ratio PC is suppressed more than in the case of Embodiment 1.

Embodiment 3

Figure 3:
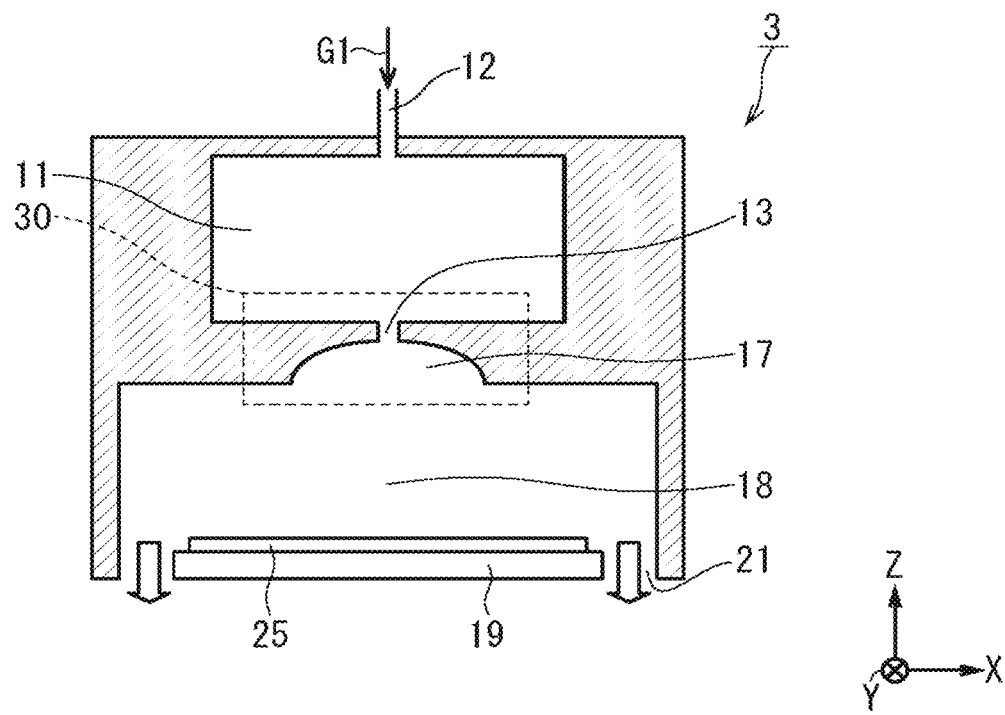
FIG. 3 is an explanatory view illustrating a configuration of a gas supply apparatus according to Embodiment 3 of the present invention.

FIG. 3 is an explanatory view illustrating a configuration of a gas supply apparatus according to Embodiment 3 of the present invention. In FIG. 3, an XYZ orthogonal coordinate system is illustrated.

As illustrated in FIG. 3, the gas supply apparatus according to Embodiment 3 includes: a mounting table 19 (mounting portion) for mounting a wafer 25 which is a substrate to be processed; and a gas ejector 3 which is provided above the mounting table 19 and supplies gas from a low-vacuum processing chamber 18 having an opening to the wafer 25.

The gas ejector 3 includes a primary accommodating chamber 11, a gas supply port 12, a first-stage restricting cylinder 13 (first restricting cylinder), a hemispherical restricting cylinder 17 (second restricting cylinder), and the low-vacuum processing chamber 18 as main components.

A nozzle portion 30 is formed of a configuration including a group of the two restricting cylinders 13 and 17. That is, the nozzle portion 30 is provided between the primary accommodating chamber 11 and the low-vacuum processing chamber 18.

Similarly to Embodiment 1, the opening of the first-stage restricting cylinder 13 (first restricting cylinder) constituting the nozzle portion 30 has a circular cross-sectional shape with a diameter r1, and supplies a source gas G1 in the primary accommodating chamber 11 downward.

The hemispherical restricting cylinder 17 is continuously formed with the first-stage restricting cylinder 13 along a Z direction. The opening of the bottom surface of the hemispherical restricting cylinder 17 has a circular cross-sectional shape with a diameter r2b (second diameter) on XY plane. The hemispherical restricting cylinder 17 supplies the source gas G1 supplied from the first-stage restricting cylinder 13 to the low-vacuum processing chamber 18 below. The diameter r2b of the bottom surface is set so as to satisfy "r2b>r1".

Since the hemispherical restricting cylinder 17 is formed in a hemispherical shape having an opening at the top, the diameter r2 of the opening is set so as to increase as it goes downward (−Z direction). That is, the diameter r2 of the opening of the hemispherical restricting cylinder 17 in plan view is set to become longer as it goes downward from a diameter r2t (=diameter r1) of the top to a diameter r2b of the bottom surface.

Note that since the other configurations of the gas ejector 3 are identical to those of the gas ejector 1 according to Embodiment 1, identical reference signs are appropriately given, and the description thereof will be omitted.

In the gas ejector 3 of the gas supply apparatus according to Embodiment 3, the nozzle portion 30 is configured of the first-stage restricting cylinder 13 and the hemispherical restricting cylinder 17 having the openings with the diameter r1 and the diameters r2 (r2t to r2b), respectively. Therefore, it is possible to give directivity to the source gas G1 ejected into the low-vacuum processing chamber 18. In this case, similarly to Embodiment 1, existence of the hemispherical restricting cylinder 17 has the effect of suppressing a Mach disk MD phenomenon.

In addition, the gas supply apparatus according to the Embodiment 3 has effects similar to those of the gas supply apparatus according to Embodiment 1, and also has the effects in the case of adopting the first to fifth aspects.

Furthermore, the hemispherical restricting cylinder 17 (second restricting cylinder) in the gas ejector 3 according to Embodiment 3 is formed into a hemispherical shape such that the diameter r2 of the opening becomes longer as it approaches the low-vacuum processing chamber 18 (in the −Z direction). Therefore, it is possible to supply the source gas G1 to the wafer 25 in a state where the occurrence of Mach disk MD caused by the high-speed jet generated at the pressure ratio PC is suppressed more than in the case of Embodiment 1.

Note that in the above-described configuration of Embodiment 3, as a modification, a third-stage restricting cylinder may be further provided under the hemispherical restricting cylinder 17, similarly to the third-stage restricting cylinder 15 according to Embodiment 2. As the shape of the third-stage restricting cylinder according to Embodiment 3, a columnar shape having a diameter identical to the diameter r2b of the bottom surface of the hemispherical restricting cylinder 17 or the like is considered.

Embodiment 4

Figure 4:
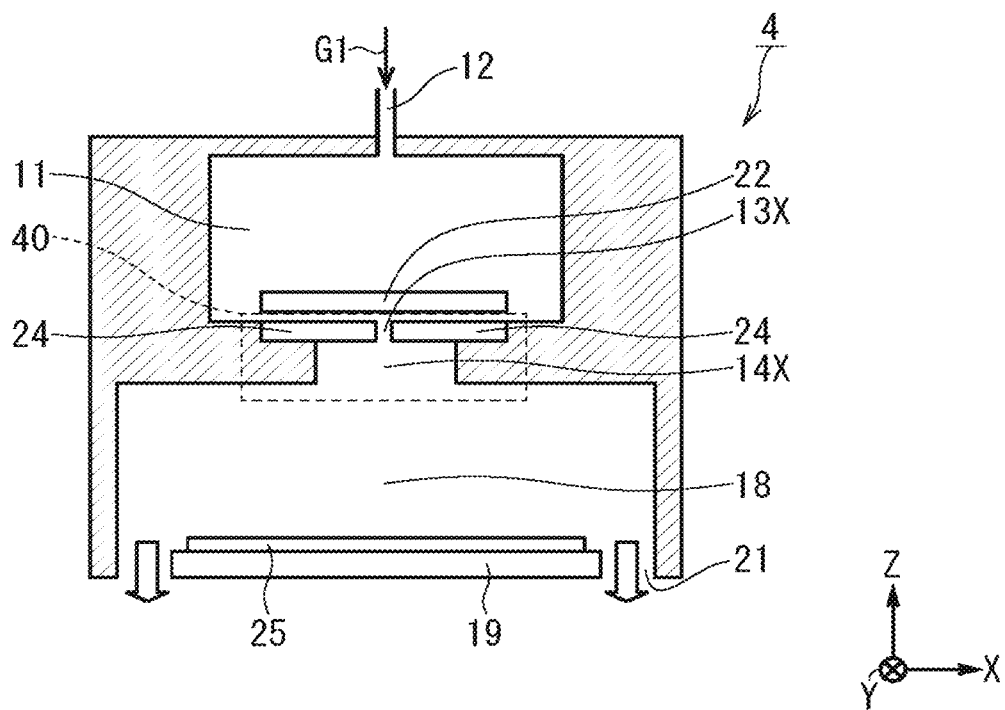
FIG. 4 is an explanatory view (part 1) illustrating a configuration of a gas supply apparatus according to Embodiment 4 of the present invention.
Figure 5:
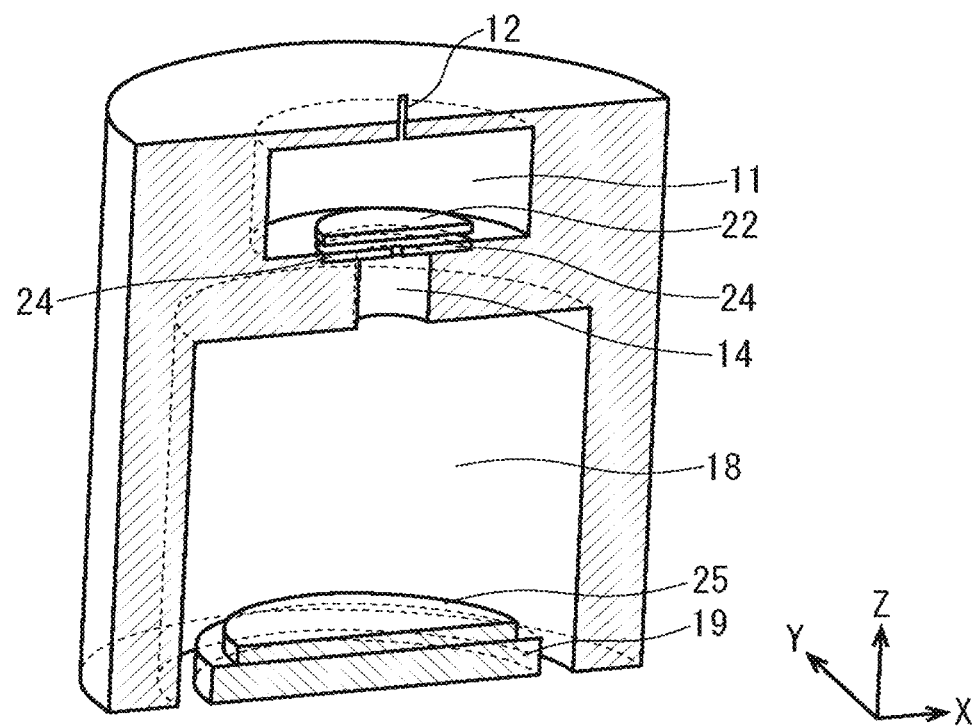
FIG. 5 is an explanatory view (part 2) illustrating the configuration of the gas supply apparatus according to Embodiment 4 of the present invention.

FIGS. 4 and 5 are explanatory views illustrating a configuration of a gas supply apparatus according to Embodiment 4 of the present invention. FIG. 4 is a cross-sectional view, and FIG. 5 is a perspective view. In each of FIGS. 4 and 5, an XYZ orthogonal coordinate system is illustrated.

As illustrated in FIGS. 4 and 5, the gas supply apparatus according to Embodiment 4 includes a mounting table 19 (mounting portion) for mounting a wafer 25 which is a substrate to be processed; and a gas ejector 4 which is provided above the mounting table 19 and supplies gas from a low-vacuum processing chamber 18 having an opening to the wafer 25.

The gas ejector 4 has a primary accommodating chamber 11, a gas supply port 12, a first-stage restricting cylinder 13X (first restricting cylinder), a second-stage restricting cylinder 14X (second restricting cylinder), an upper electrode 22, a lower electrode 24, and the low-vacuum processing chamber 18 as main components.

A nozzle portion 40 is formed of a configuration including a group of the two restricting cylinders 13X and 14X, and the lower electrode 24. That is, the nozzle portion 40 is provided between the primary accommodating chamber 11 and the low-vacuum processing chamber 18.

The upper electrode 22 and the lower electrode 24 each having a dielectric such as alumina on surfaces facing each other are circular on XY plane (in plan view) and are provided so as to face each other. Note that a configuration may be possible in which a dielectric is provided only on one of the surfaces of the upper electrode 22 and the lower electrode 24, the surfaces facing each other.

That is, the gas ejector 4 has the upper electrode 22 and the lower electrode 24 (first and second electrodes) provided so as to face each other. A discharge space is formed between the upper electrode 22 and the lower electrode 24. At least one of the upper electrode 22 and the lower electrode 24 has a dielectric on the surface forming the discharge space.

Specifically, the upper electrode 22 is disposed near the bottom surface in the primary accommodating chamber 11. In contrast, the lower electrode 24 is arranged under the bottom surface of the primary accommodating chamber 11 so as to form part of the bottom surface of the primary accommodating chamber 11. A through hole provided at the center of the lower electrode 24 serves as the first-stage restricting cylinder 13X.

Similarly to the first-stage restricting cylinder 13 according to Embodiment 1, the opening of the first-stage restricting cylinder 13X (first restricting cylinder) constituting the nozzle portion 40 has a circular cross-sectional shape with a diameter r1 (first diameter) on XY plane (in plan view), and supplies a source gas G1 in the primary accommodating chamber 11 downward.

The second-stage restricting cylinder 14X is continuously formed just under the lower electrode 24 including the first-stage restricting cylinder 13X along a Z direction. Similarly to the second-stage restricting cylinder 14 according to Embodiment 1, the opening of the second-stage restricting cylinder 14X has a circular cross-sectional shape with a diameter r2 (second diameter) on XY plane (in plan view), and supplies the source gas G1 supplied from the first-stage restricting cylinder 13X to the low-vacuum processing chamber 18 below. The diameter r2 is set so as to satisfy "r2>r1".

As described above, the gas ejector 4 according to Embodiment 4 has a gas ionization unit inside. The gas ionization unit ionizes the source gas G1 to obtain an ionized or radicalized gas in the discharge space between the upper electrode 22 and the lower electrode 24 facing each other with the dielectric interposed therebetween.

The gas ionization unit has a discharge space between the upper electrode 22 and the lower electrode 24 facing each other with the dielectric interposed therebetween. The gas ionization unit can apply an alternating voltage between the upper electrode 22 and the lower electrode 24, generate dielectric-barrier discharge in the discharge space, and supply an ionized gas or a radicalized gas obtained by ionizing or radicalizing the source gas G1 into the low-vacuum processing chamber 18 via the second-stage restricting cylinder 14X.

As described above, the gas ejector 4 according to Embodiment 4 is characterized by including the gas ionization unit which is provided near a boundary region between the primary accommodating chamber 11 and the nozzle portion 40, and produces an ionized gas or a radicalized gas which is an ionized or radicalized source gas G1 obtained by ionizing the source gas G1 supplied from the gas supply port 12.

Note that since the other configurations of the gas ejector 4 are identical to those of the gas ejector 1 according to Embodiment 1, identical reference signs are appropriately given, and the description thereof will be omitted.

In the gas ejector 4 of the gas supply apparatus according to Embodiment 4, the nozzle portion 40 is configured of the first-stage restricting cylinder 13X and the second-stage restricting cylinder 14X having the openings with the diameter r1 and the diameter r2, respectively. Therefore, it is possible to give directivity to the source gas G1 ejected into the low-vacuum processing chamber 18. In this case, similarly to Embodiment 1, existence of the second-stage restricting cylinder 14X has the effect of capable of suppressing a Mach disk MD phenomenon.

In addition, the gas supply apparatus according to the Embodiment 4 has effects similar to those of the gas supply apparatus according to Embodiment 1, and also has the effects in the case of adopting the first to fifth aspects. In this case, as heating processing according to the second aspect of Embodiment 4, a discharge process between the upper electrode 22 and the lower electrode 24 can be utilized.

Furthermore, the gas ejector 4 according to Embodiment 4 can cause the above gas ionization unit to perform gas discharge in the gas ejector 4, and can directly apply an ionized gas or a radicalized gas which is a directional ultra-high-speed jet gas to the surface of the wafer 25 from the low-vacuum processing chamber 18. Therefore, as compared with the plasma CVD/ALD apparatus which is a conventional film forming apparatus, the gas ejector 4 according to Embodiment 4 can apply an activated ionized gas or an activated radicalized gas having higher density and a higher electric field to the surface of the wafer 25, and realize a higher-quality film formation process. The gas ejector 4 has effects of easily forming a film on the wafer 25 with high aspect ratio and a film having a three-dimensional structure.

Furthermore, in the gas ejector 4 according to Embodiment 4, the above gas ionization unit has the discharge space between the upper electrode 22 and the lower electrode 24 facing each other with the dielectric interposed therebetween. An alternating voltage is applied between the upper electrode 22 and the lower electrode 24, dielectric-barrier discharge is generated in the discharge space, and an ionized gas or a radicalized gas obtained by ionizing or radicalizing the source gas G1 can be supplied. At this time, considering that the ionized gas and the radical gas have very short lifetimes, in order to apply the generated ionized gas or radicalized gas to the surface of the substrate to be processed in a short time, a dielectric-barrier discharge mechanism (the upper electrode 22 and the lower electrode 24) is provided in the gas ejector 4. Therefore, it is possible to achieve an effect of enabling a high-quality film formation process by using the supplied ionized gas or radicalized gas.

Specifically, the first-stage restricting cylinder 13X is configured as the through hole formed in the lower electrode 24 (second electrode), and the discharge gas is ejected into the low-vacuum processing chamber 18. Therefore, it is possible to apply the ionized gas or the radicalized gas generated by the dielectric-barrier discharge to the surface of the wafer 25 in an extremely short time of a millisecond or less. Therefore, the gas supply apparatus according to Embodiment 4 can apply even the ionized gas or the radicalized gas which is generated by the discharge and has a very short lifetime, to the surface of the wafer 25 while suppressing attenuation to the minimum. Therefore, the gas supply apparatus has effects of enabling film formation at a low temperature and increasing film formation speed.

The above-described Embodiment 4 describes a case where the shape of each of the upper electrode 22 and the lower electrode 24 in plan view is circular; however, it is a matter of course that the shape is not limited to this shape.

Embodiment 5

Figure 6:
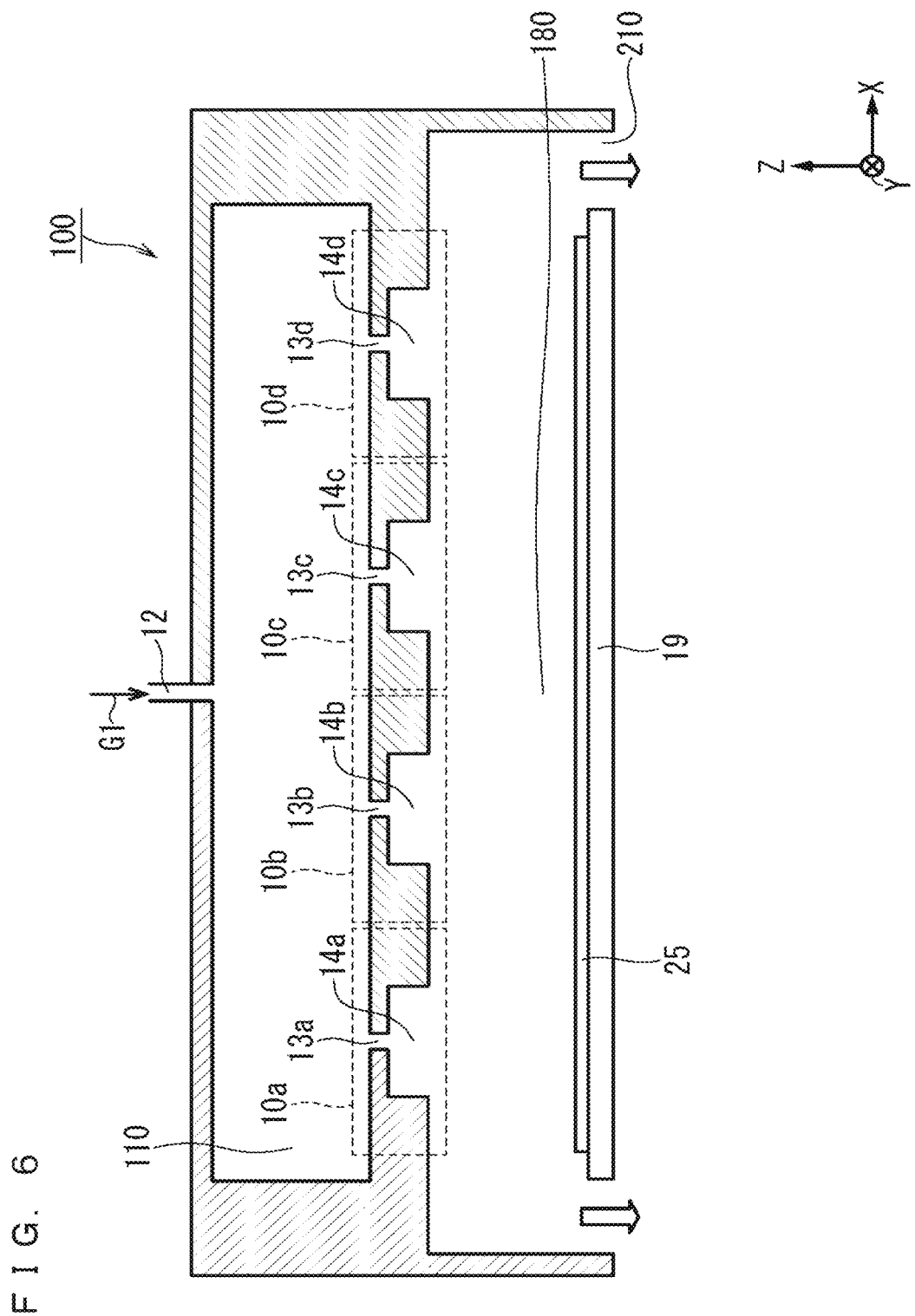
FIG. 6 is an explanatory view illustrating a configuration of a gas supply apparatus according to Embodiment 5 of the present invention.

FIG. 6 is an explanatory view illustrating a configuration of a gas supply apparatus according to Embodiment 5 of the present invention. In FIG. 6, an XYZ orthogonal coordinate system is illustrated.

As illustrated in FIG. 6, the gas supply apparatus according to Embodiment 5 includes: a mounting table 19 (mounting portion) for mounting a wafer 25 which is a substrate to be processed; and a gas ejector 100 which is provided above the mounting table 19 and supplies gas from a low-vacuum processing chamber 180 having an opening to the wafer 25.

The gas ejector 100 includes a primary accommodating chamber 110, a gas supply port 12, first-stage restricting cylinders 13a to 13d (a plurality of first restricting cylinders), second-stage restricting cylinders 14a to 14d (a plurality of second restricting cylinders), and the low-vacuum processing chamber 180 as main components.

Nozzle portions 10a to 10d are formed of configurations including the first-stage restricting cylinders 13a to 13d and the second-stage restricting cylinders 14a to 14d, respectively. That is, the nozzle portions 10a to 10d are provided between the primary accommodating chamber 110 and the low-vacuum processing chamber 180. The nozzle portion 10a is configured of the first-stage restricting cylinder 13a and the second-stage restricting cylinder 14a. The nozzle portion 10b is configured of the first-stage restricting cylinder 13b and the second-stage restricting cylinder 14b. The nozzle portion 10c is configured of the first-stage restricting cylinder 13c and the second-stage restricting cylinder 14c. The nozzle portion 10d is configured of the first-stage restricting cylinder 13d and the second-stage restricting cylinder 14d.

Similarly to the first-stage restricting cylinder 13 according to Embodiment 1, the opening of each of the first-stage restricting cylinders 13a to 13d (plurality of first restricting cylinders) has a circular cross-sectional shape with a diameter r1 in plan view, and supplies a source gas G1 in the primary accommodating chamber 110 downward.

The second-stage restricting cylinders 14a to 14d (second restricting cylinders) are continuously formed with the first-stage restricting cylinders 13a to 13d along a Z direction, respectively. Similarly to the second-stage restricting cylinder 14 according to Embodiment 1, the opening of each of the second-stage restricting cylinders 14a to 14d has a circular cross-sectional shape with a diameter r2 in plan view. The second-stage restricting cylinders 14a to 14d supply downward the source gas G1 supplied from the first-stage restricting cylinder 13a to 13d, respectively. After the gas has been reacted, the gas is exhausted from an exhaust port 210 provided between the gas ejector 100 and the mounting table 19.

Note that since the other configurations of the gas ejector 100 are similar to those of the gas ejector 1 according to Embodiment 1, identical reference signs are appropriately given, and the description thereof will be omitted.

In the gas ejector 100 of the gas supply apparatus according to Embodiment 5, the nozzle portions 10a to 10d (the plurality of nozzle portions) are configured of the first-stage restricting cylinders 13a to 13d and the second-stage restricting cylinders 14a to 14d having the diameter r1 and the diameter r2, respectively. Therefore, it is possible to give directivity to the source gas G1 ejected into the low-vacuum processing chamber 180. In this case, similarly to Embodiment 1, existence of the second-stage restricting cylinders 14a to 14d provides an effect of effectively suppressing a Mach disk MD phenomenon.

In addition, the gas supply apparatus according to the Embodiment 5 has effects similar to those of the gas supply apparatus according to Embodiment 1, and also has the effects in the case of adopting the first to fifth aspects.

Furthermore, the gas ejector 100 according to Embodiment 5 can uniformly apply high-speed gas having directivity from the nozzle portions 10a to 10d (the plurality of nozzle portions) to the entire surface of the wafer 25, and can perform a high-quality and uniform film formation process in a relatively short time even upon film formation on the wafer 25 with high aspect ratio and upon three-dimensional film formation on the surface of the wafer 25 having a three-dimensional structure.

In addition, a sixth aspect may be adopted in which when the diameters r1 of the first-stage restricting cylinders 13a to 13d are set to diameters r1a to r1d, the diameters r1a to r1d are set to different values. That is, the sixth aspect may be adopted in which the diameters r1 of the nozzle portions 10a to 10d differ from one another.

In the gas supply apparatus according to Embodiment 5 adopting the sixth aspect, flow rates and speeds of gas ejected from the nozzle portions 10a to 10d are controlled such that the flow rates and the speeds differ from one another. Therefore, for example, if the gas amounts of the source gas G1 containing an ionized gas, a radicalized gas, or the like ejected from the nozzle portions 10a to 10d are independently controlled correspondingly to the locations on the surface of the wafer 25 where the gas hits, an effect is provided that leads to an improvement in film formation quality such as uniform film formation on the entire surface of the wafer 25.

In addition, a seventh aspect may be adopted in which the structure of each of the nozzle portions 10a to 10d is similar to that of the nozzle portion 40 according to Embodiment 4, and a plurality of gas ionization units provided correspondingly to the nozzle portions 10a to 10d can be controlled independently.

The plurality of gas ionization units provided correspondingly to the nozzle portions 10a to 10d (the plurality of nozzle portions) can be controlled independently. Therefore, by controlling the plurality of ejected gas amounts of the ionized gas or the radicalized gas and discharge power, the gas amount of the ionized gas or the radicalized gas to be ejected and the discharge power can be controlled correspondingly to the location on the surface of the wafer 25 where the gas hits. As a result, the seventh aspect in the gas supply apparatus according to Embodiment 5 provides an effect that leads to an improvement in film formation quality such as uniform film formation on the entire surface of the wafer 25.

Note that in Embodiment 5 described above, the structure similar to that of the nozzle portion 10 according to Embodiment 1 is adopted as the structure of each of the nozzle portions 10a to 10d. However, as the structure of each of the nozzle portions 10a to 10d, a structure similar to that of the nozzle portion 20 according to Embodiment 2, the nozzle portion 30 according to Embodiment 3, or the nozzle portion 40 according to Embodiment 4 may be adopted.

In the sixth aspect of Embodiment 5, when the diameters r1 of the first-stage restricting cylinders 13a to 13d are set to the diameters r1a to r1d, the diameters r1a to r1d are set to values different from one another. Furthermore, when the diameters r2 of the second-stage restricting cylinders 14a to 14d are set to diameters r2a to r2d, the diameters r2a to r2d may be set to values different from one another (a first modification). In addition, in the case of the configuration where each of the nozzle portions 10a to 10d according to Embodiment 5 further includes a third-stage restricting cylinder 15 (15a to 15d) as in Embodiment 2, when diameters r3 of the third-stage restricting cylinders 15a to 15d are set to diameters r3a to r3d, the diameters r3a to r3d may be set to values different from one another (a second modification).

In the gas supply apparatus according to Embodiment 5 adopting the first and second modifications of the sixth aspect, flow rates and speeds of gas ejected from the nozzle portions 10a to 10d are variably controlled such that the flow rates and the speeds differ from one another. In addition, even in a case where each of the nozzle portions 10a to 10d has the configuration of the nozzle portion 30 according to Embodiment 3 or the configuration of the nozzle portion 40 according to Embodiment 4, the above-described first or second modification may be adopted and the diameters r2 (including the diameters of the third-stage restricting cylinders according to the modification) of the hemispherical restricting cylinders 17, the diameters r2 of the second-stage restricting cylinders 14X, or the like may be set to different values among the nozzle portions 10a to 10d.

OTHERS

In the above-described embodiments, the maximal number of stages of restricting cylinders is three (Embodiment 2). However, a configuration of providing four or more stages of restricting cylinders is naturally considered, such as providing a fourth-stage restricting cylinder below the third-stage restricting cylinder 15 according to Embodiment 2.

While the present invention has been described in detail, the foregoing description is in all aspects illustrative and the present invention is not limited thereto. It is understood that innumerable modifications not illustrated can be envisaged without departing from the scope of the present invention.

The invention claimed is:

1. A gas supply apparatus comprising:
a mount for mounting a substrate to be processed;
a gas ejector above said mount, said gas ejector including
    a processing chamber that extends at least partially along said mount; and
an exhaust port between said processing chamber and said mount, wherein
    said gas ejector includes:
        a primary accommodating chamber which temporarily accommodates gas supplied from a gas supply port; and
        a nozzle portion between said primary accommodating chamber and said processing chamber, wherein the nozzle portion supplies gas through said processing chamber to said substrate to be processed;
    said nozzle portion has:
        a first restricting cylinder in an uppermost portion of said nozzle portion, the first restricting cylinder having a first opening having a circular cross-sectional shape with a first diameter in plan view, and which supplies the gas in said primary accommodating chamber downward;
        a second restricting cylinder being continuously formed with said first restricting cylinder, the second restricting cylinder having a second opening having a circular cross-sectional shape with a second diameter in plan view, and which supplies the gas supplied from said first restricting cylinder to said processing chamber; and
        a third restricting cylinder in a lowermost portion of said nozzle portion and being continuously formed with said second restricting cylinder, the third restricting cylinder having a third opening having a circular cross-sectional shape with a third diameter in plan view, and which supplies the gas supplied from said second restricting cylinder to said processing chamber,
    said gas ejector has only one said nozzle portion,
    said first diameter is set such that pressure difference between said primary accommodating chamber and said processing chamber is not less than 30 times,
    said second diameter is longer than said first diameter,
    said third diameter is longer than said second diameter, said first diameter of said first restricting cylinder is not greater than 2 mm in diameter and a formation length of said first restricting cylinder is not greater than 2 mm, said first diameter is constant along a height direction in said first restricting cylinder, said second diameter is constant along the height direction in said second restricting cylinder, said third diameter is constant along the height direction in said third restricting cylinder, and said nozzle portion has only one of said first restricting cylinder, one of said second restricting cylinder and one of said third restricting cylinder.

2. The gas supply apparatus according to claim 1, wherein said second diameter of said second restricting cylinder is within 30 mm in diameter.

3. The gas supply apparatus according to claim 1, wherein said gas ejector includes one of quartz and an alumina material as a constituent material.

4. The gas supply apparatus according to claim 1, wherein said gas ejector is heated to not lower than 100° C. so as to supply heated gas to said substrate to be processed.

5. The gas supply apparatus according to claim 1, wherein the gas supplied from said gas supply port is gas containing at least nitrogen, oxygen, fluorine, and hydrogen.

6. The gas supply apparatus according to claim 1, wherein the gas supplied from said gas supply port is a precursor gas.

7. The gas supply apparatus according to claim 1, wherein a gas flow rate of the gas supplied from said gas supply port is controlled such that pressure in said processing chamber is not higher than atmospheric pressure and not lower than 10 kPa.

8. The gas supply apparatus according to claim 1 further comprising:

a gas ionizer near a boundary region between said primary accommodating chamber and said nozzle portion, wherein the gas ionizer produces one of an ionized gas and a radicalized gas by ionizing the gas supplied from said gas supply port.

9. The gas supply apparatus according to claim 8, wherein said gas ionizer includes a first electrode and a second electrode facing each other, a discharge space being between said first electrode and said second electrode, and at least one of said first electrode and said second electrode has a dielectric on a surface forming said discharge space, said first restricting cylinder is formed of a through hole formed in said second electrode, and one of said ionized gas and said radicalized gas is supplied to said processing chamber, the one of said ionized gas and said radicalized gas being obtained by applying an alternating voltage between said first electrode and said second electrode, and generating dielectric-barrier discharge in said discharge space.

10. The gas supply apparatus according to claim 1, wherein a transition between the second diameter and the third diameter is not continuous.

11. The gas supply apparatus according to claim 1, wherein the third diameter is a largest diameter of the nozzle portion.

12. The gas supply apparatus according to claim 1, said nozzle portion consists essentially of said first restricting cylinder, said second restricting cylinder and said third restricting cylinder.

* * * * *